United States Patent [19]
Omid-Zohoor et al.

[11] Patent Number: 5,973,372
[45] Date of Patent: Oct. 26, 1999

[54] SILICIDED SHALLOW JUNCTION TRANSISTOR FORMATION AND STRUCTURE WITH HIGH AND LOW BREAKDOWN VOLTAGES

[76] Inventors: Farrokh Omid-Zohoor, 8910 Shady Hills, San Antonio, Tex. 78250; Nader Radjy, 614 Greer Rd., Palo Alto, Calif. 94303

[21] Appl. No.: 08/986,283
[22] Filed: Dec. 6, 1997
[51] Int. Cl.⁶ .................................................. H01L 29/861
[52] U.S. Cl. .......................... 257/383; 257/754; 257/770; 438/607
[58] Field of Search ..................................... 257/382, 383, 257/384, 754, 757, 769, 770; 438/607, 682, 683

[56] References Cited

U.S. PATENT DOCUMENTS 5,225,896  7/1993  Van Roozendaal et al. ........... 257/384
5,416,034  5/1995  Bryant ....................................... 437/47

Primary Examiner—David B. Hardy
Attorney, Agent, or Firm—Foley & Lardner

[57] ABSTRACT

A method, and structure resulting therefrom, of forming a metal silicide at a shallow junction in a single crystal substrate without encroaching on the shallow junction by forming a metal layer on the substrate over the junction followed by forming a layer of a silicon material which reacts with the metal faster than the silicon in the single crystal substrate. Titanium is the preferred metal and amorphous silicon is the preferred silicon layer and is of a thickness to react with all of the titanium. The two layers are rapid thermal annealed to form titanium silicide. A second rapid thermal anneal is performed which converts the majority of the C49 phase of the titanium silicide to a less resistive and more conductive C54 phase and causes a silicon epitaxial layer to form between silicon substrate and the titanium silicide.

13 Claims, 4 Drawing Sheets

SILICIDED SHALLOW JUNCTION TRANSISTOR FORMATION AND STRUCTURE WITH HIGH AND LOW BREAKDOWN VOLTAGES

FIELD OF THE INVENTION

The present invention relates to fabricating integrated circuits and, more specifically, to fabricating silicided shallow junctions and the resultant structure.

BACKGROUND OF THE INVENTION

In the conventional self aligned silicides fabrication, which is has been given the name "salicide process", the silicidation process usually is carried out after the formation of the junctions. In the case of NMOS, PMOS, CMOS and BiCMOS, the silicidation process is after the source/drain implant and anneal and, in the case of bipolar, the silicidation process is after the emitter to base junction formation and anneal. For example, in the conventional CMOS fabrication process, after the gate definition, LDD implant, spacer formation and source/drain implant screen oxide, the source and drains are implanted and annealed. After removal of the screen oxide and a clean step, titanium or another refractory metal or Group VIII metals is deposited and annealed to form the silicide, such as titanium silicide. During the silicidation process with titanium, the silicon is the moving species and, as the silicide is formed, the silicon below the original silicon surface is consumed. It is well established that 1 angstrom of titanium (Ti) will react with 2.27 angstroms of crystalline silicon to produce 2.4 angstroms of titanium silicide ($TiSi_2$).

Advanced high performance submicron NMOS, PMOS, CMOS, biCMOS and bipolar integrated circuits require further down scaling of the devices in the lateral and vertical directions. However, as the gate length is scaled down, the vertical dimension of the devices, such as gate oxide thickness and junction depth need to be scaled down accordingly for optimum performance of the devices and to alleviate short channel effects. However, as vertical and laterally scaling of these devices continues, the fabrication of very shallow junctions create additional challenges due to the very low implant energy required to fabricate very shallow junctions and the higher parasitic source and drain resistance for field effect transistors (FETs), such as CMOS, and emitter resistance for bipolar introduced by the shallow junctions, as well as excessive off leakage current for FETs. To reduce the parasitic resistances, these advanced integrated circuits employ silicides at the shallow junctions and thereby increase device speed and performance. However, a major portion (~one-half) of the originally implanted shallow junction in the silicon substrate is consumed by the silicidation in the conventional salicidation process and such consumption of the silicon substrate during silicidation degrades the integrity of the shallow junctions and sets a lower limit for the junction depth. A similar situation exists in using the conventional method in fabricating silicided shallow emitters in bipolar or biCMOS integrated circuits. In addition, the junction depths of the silicided sources and drains or the junction depth of the silicided emitters are all the same depth and have common device characteristics.

SUMMARY OF THE INVENTION

Accordingly, it is an object of the present invention to provide a method of fabricating an integrated circuits with salicided shallow junctions without degrading the integrity of the junctions.

Another object of present invention is to provide an integrated circuit fabrication method in which only a minimum of the silicon substrate is consumed during salicidation.

An additional object of the present invention is to provide an integrated circuit structure with silicided shallow junctions with the lower surface of the silicide at or slightly below the silicon substrate.

A further object of the present invention is to provide an integrated circuit fabrication method in which, due to the salicidation process, the transistors of the integrated circuit can be formed with different device characteristics.

A still further object of the present invention is to provide an integrated circuit fabrication method in which, due to the salicidation process, the source and drain of a transistor can be formed with asymmetric junction depths.

In accordance with the present invention, an integrated circuit silicon substrate with at least one shallow junction is fabricated comprising the steps of, after the formation of a shallow junction: depositing a metal layer capable of reacting with silicon to form a silicide at the shallow junction, selectively depositing on the metal a layer of a silicon material which reacts with a metal to form a silicide at a faster rate than silicon in the silicon substrate, and reacting the silicon of the deposited silicon material with the metal to form the metal silicide. Preferably, the metal is a refractory metal or a Group VIII metal and, most preferably, the metal is titanium and the silicon material is amorphous ($\alpha$) silicon, of which metal preferably is selectively deposited and the $\alpha$-silicon is sputtered. The silicon material is of a thickness so that the majority of the metal reacts with the silicon of the silicon material and only a small amount of the silicon of the silicon substrate is consumed during the silicide reaction. According to another aspect of the present invention, the deposited silicon material can be doped and the doping can be used as a parameter to control the amount of silicon contibuted from the silicon material and thereby permit different junction depths between transistors in an integrated circuit or even between a source and a drain of the same transistor. According to still another aspect of the present invention, an integrated circuit including a silicon substrate having an upper surface and a shallow junction disposed thereunder comprising: a metal silicide layer having a lower surface and being disposed at the shallow junction, and a silicon epitaxy layer positioned between the upper surface of the silicon substrate and the lower surface of the metal silicide.

BRIEF DESCRIPTION OF THE DRAWINGS

The foregoing and other objects, aspects and advantages will be better understood from the following detailed description of a preferred embodiments of the invention with reference in the drawings, in which.

DETAILED DESCRIPTION OF THE PREFERRED EMBODIMENTS OF THE INVENTION

Figure 1A:
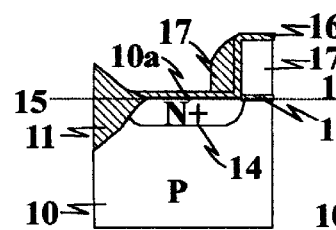
FIGS. 1a, b and c are cross-sectional views of the prior art method of forming a refractory metal silicide at the surface of an active region of a transistor.
Figure 1B:
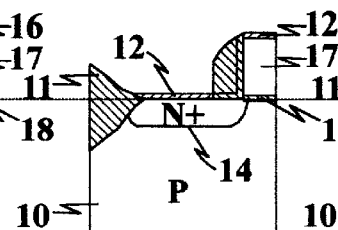
Figure 1C:
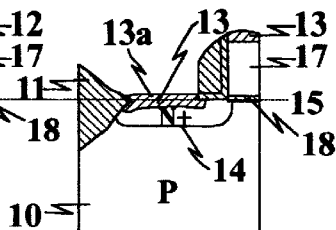

Referring now to the prior art drawings of FIGS. 1(a)–(c), FIG. 1(a) shows a single crystalline P doped silicon substrate 10 with LOCOS isolation 11 and N-type impurities to form a P-N+ shallow junction 14 with the surface 10a of the substrate 10 exposed. A insulating layer 16 is on the surface 10a of the substrate 10 and on the vertical wall of a gate 17 on a gate oxide 18 of a partially shown NMOS field effect transistor. An insulating spacer 19 is formed on the vertical wall of the gate 17. The layer 16 served as an implant screen during the formation of the shallow junction. In FIG. 1(b), the insulating layer is removed and a refractory metal, such as a titanium layer 12, is deposited on the now exposed surface 10a. In FIG. 1(c) titanium silicide 13 is formed by reacting the titanium 12 with the silicon substrate 10. It will be noted that shape of the titanium silicide 13 is above the original substrate surface 10a as evidenced by the dashed line 15 drawn through FIGS. 1(a)–(c). More importantly, it will be noted that the major growth of the titanium silicide is into the silicon substrate, again as evidence by the dashed line 15, and the greatest growth is at the edges where the N+ impurities are in lower concentration than in the center of the active region. Because of this shape of the titanium silicide, the shallow junction becomes ever more shallow and the result is degrading of the integrity of the shallow junctions.

Figure 2A:
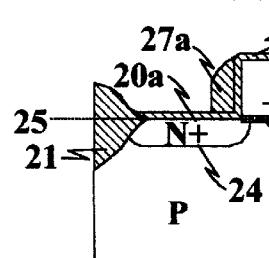
FIGS. 2a, b and c are cross-sectional views of method of the present invention of forming a refractory metal silicide at the surface of an active region of a transistor.
Figure 2B:
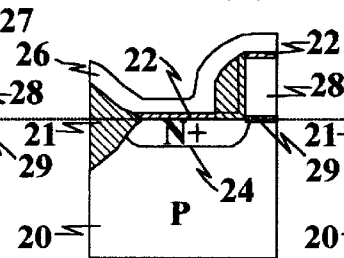
Figure 2C:
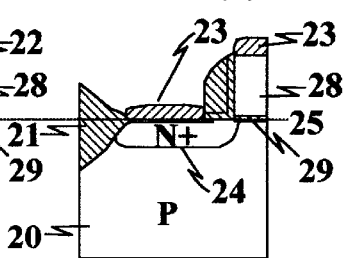

Turning now to FIGS. 2(a)–(c) of the present invention, FIG. 2(a) again shows a single crystalline P doped silicon substrate 20 with LOCOS isolation 21 and N-type impurities to form a N+/P shallow junction 24 with the surface 20a of the substrate 20 exposed. A insulating layer 27 is preferably thermally grown on the surface 20a of the substrate 20 and on the vertical wall and top of a gate 28 on a gate oxide 29 of a partially shown NMOS field effect transistor. A insulating spacer 27a, preferably silicon nitride, is formed on the vertical wall of the gate 28. The layer 27 served as an implant screen during the formation of the shallow junction and the doping of the gate. The layer 27 also can serve as an etch stop during the formation of the silicon nitride spacer due to the difference in etch selectivity between silicon oxide and silicon nitride. In FIG. 2(b), a refractory metal, such as a titanium, or a Group VIII metal layer 22 is selectively deposited on the exposed surface 20a followed by the deposition, on the titanium layer 22, of a layer of a silicon containing material 26, such as amorphous (α) silicon, which silicides at a faster rate than single crystal silicon. In FIG. 2(c), titanium silicide 23 is formed by reacting the titanium 22 with the amorphous silicon 26 and slightly with the silicon substrate at a temperature of about 650 C. In the prior art silicidation method with the single crystal substrate of FIGS. 1(a)–(c), the silicon atoms migrate towards the titanium atoms where they react and form $TiSi_x$ (phase C49). The silicon atoms diffuse towards the titanium atoms through the crystal vacancies or regions which are referred to as the centers for nucleation. Because, in contrast to single crystal silicon, amorphous silicon has many more centers of nucleation and the migration occurs at a much faster rate. Silicon atoms from the amorphous silicon layer 26 and silicon atoms from the single crystal substrate 10 and polycrystalline silicon gate 28 migrate from the top to the bottom and from the bottom to the top, respectively, to the titanium layer 22. The reaction stops when all of the titanium layer 22 is reacted. Since the amorphous silicon silicides much faster than the single crystal substrate, most of the silicidation occurs upward away from the original silicon surface 20a, as evidenced by dashed line 25, and only a very small portion of shallow junction is consumed, unlike the prior art method of FIGS. 1(a)–(c). It is important to note that the silicide formed from single crystal silicon and amorphous silicon is C54 phase after a second anneal. With a thick amorphous silicon layer 26, which is sufficiently thick so as to not be totally consumed by the silicidation, silicon atoms from the amorphous silicon layer migrate through the titanium silicide 23 and to the single crystal silicon substrate and, in accordance with the device structure of the present invention, form a solid phase epitaxy layer as shown in the vicinity of the silicide and the N+ boundry in FIG. 2(c). Accordingly, because the titanium silicide 23 is at or above the original silicon surface 10a, the shallow junction is not consumed and the integrity of the shallow junction is maintained.

Figure 3A:
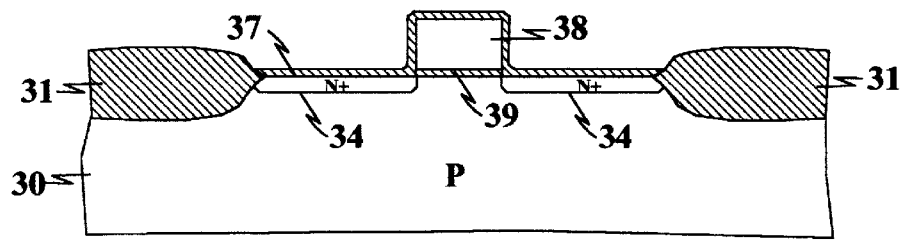
FIG. 3a is a cross-sectional view of the portion of a semiconductor substrate with isolation regions on opposite sides of a partially completed field effect transistor having a source, drain and gate and a conformal insulating layer over the source and drain and covering the gate as the starting point in describing the method of the present invention.
Figure 3B:
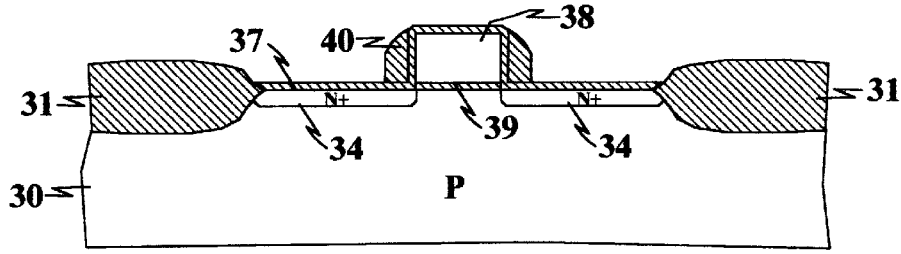
FIG. 3b is a cross-sectional view of the portion of the semiconductor substrate of Figure a with insulating sidewalls abutting the insulating layer on the gate.
Figure 3C:
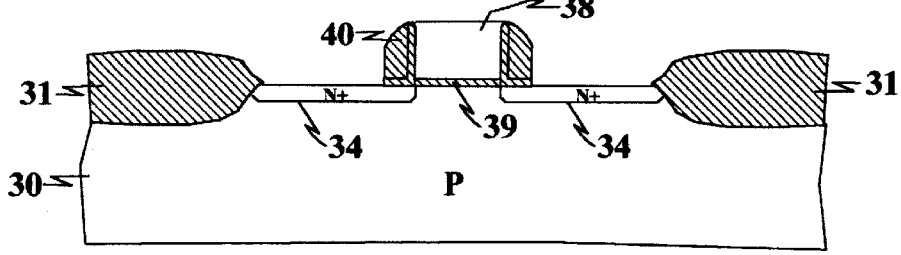
FIG. 3c is a cross-sectional view of the portion of the semiconductor substrate of FIG. 3b with the insulating layer removed over the source and drain and on top of the gate.

Turning now to FIGS. 3a–3i, which illustrate the fabrication method of the present invention, FIG. 3a shows the cross-section of a NMOS field effect transistor (FET) to the point of a silicon substrate 30 having formed therein isolation regions 31, herein LOCOS although trench isolation also can be used. A thin insulating layer 37, preferably silicon oxide, is on the surface of the silicon substrate and covers a gate 38, which is doped polysilicon but also may be a composite gate structure, on a gate oxide 39. N-type impurities or, alternatively, P-type have been implanted into silicon substrate 30 and the gate 38, using the gate as the alignment mask, and annealed by rapid thermal anneal to diffuse and activate the impurities and form a N+/P or P+/N shallow junction 34. The shallow junctions are less than about 2500 Å and, with arsenic (As) as the impurity, the desired depth of the N+/P shallow junctions can be achieved by projecting 500 Å for implant energies of 75 keV. In the case of shallow P+/N junction, boron difluoride ($BF_2$) is used as the impurity and the desired depth can be achieved by projecting about 300 Å for implant energies of 50 keV. In the present instant, the depth of the N+/P shallow junction is about 1000 Å and the P+/N shallow junction is about 1200 Å from the silicon substrate surface. In FIG. 3b, insulating spacers 40 are formed is formed on the sidewalls of the gate 38 and is separated from the gate by the insulating layer 37. The spacers 40 preferably are silicon nitride and are formed by depositing a conformal layer of silicon nitride and then anisotropically etching the layer with a reactive ion etcher to create the spacers 40. Silicon nitride is the preferred insulating material because the silicon oxide layer 37 serves as an etch stop during the formation of the spacer and prevents gouging of the silicon substrate. In addition, the silicon nitride spacer is not eroded away during the removal by etching of the silicon oxide screen layer 37, thereby precluding any possible shorting of the gate 38. After the spacers formation, the substrate is cleaned and subjected to a short hydrogen fluoride etch (herein 100:1) to remove the insulating layer 37, herein silicon oxide, over the source and drain and on top of the gate 38 as shown in FIG. 3c. As previously stated, the removal of the silicon oxide layer is a further reason for using silicon nitride as the insulating spacer material since silicon nitride has a etch selectivity difference from silicon oxide.

Figure 3D:
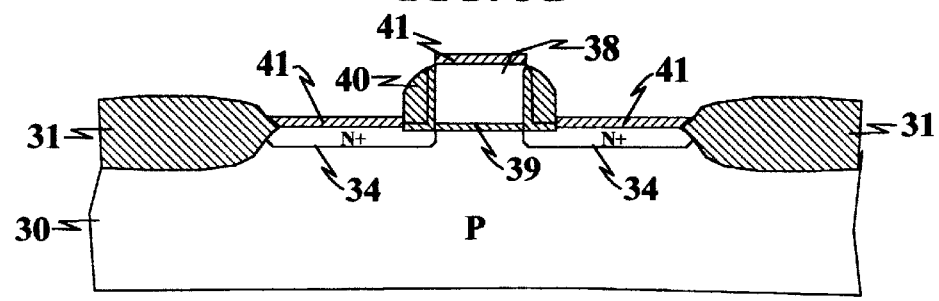
FIG. 3d is a is a cross-sectional view of the portion of the semiconductor substrate of FIG. 3c with a refractory metal selectively deposited on semiconductor substrate surface over the source and drain and on top of the gate.
Figure 3E:
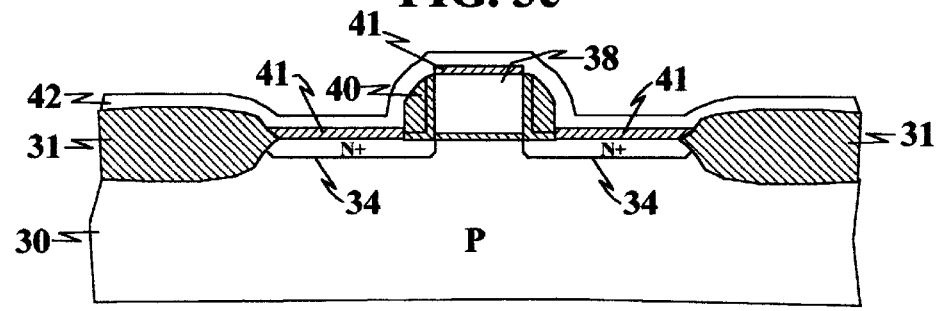
FIG. 3e is a cross-sectional view of the portion of the semiconductor substrate of FIG. 3d with a layer of a silicon containing material deposited on the isolation regions, the refractory metal and the sidewalls.

Next, a refractory metal 41, herein titanium, or a Group VIII is selectively deposited by chemical vapor deposition (CVD), using conventional CVD equipment on the exposed source and drain and on top of gate to a thickness of about 300–400 Å, preferably about 400 Å, as shown in FIG. 3d. Although titanium is preferred, other refractory metals, such as tungsten, tantalum and molybdenum, as well as Group VIII metals, such as cobalt, platinum, palladium and nickel, may be used. Now, in accordance with the present invention, a silicon containing material 42 which silicates faster than single crystal silicon and which herein is amorphous silicon is sputter deposited, using conventional sputter equipment with a silicon target, to a thickness of about 650 to 850 Å, preferably about 850 Å as shown in FIG. 3e. Although amorphous silicon is the preferred silicon containing material, polycrystalline silicon also may be used.

In addition and in accordance with another aspect of the present invention, the silicon containing material may be doped with an impurity since silicidation occurs less readily with doped amorphous and polysilicon than undoped amorphous silicon and polysilicon. By varying the doping of the amorphous silicon, silicidation reaction rate can be a parameter for controlling the amount of silicon (N+ for N+ source/drain or P+ for P+ source/drain) in the substrate. For N+/P junctions, the amorphous silicon can be doped with an N-type impurity such as phorphous, arsenic, or antimony and, for P+/N junctions, the amorphous silicon can be doped with boron or boron difluoride. With this aspect of the present invention, the amount of silicate from the amorphous silicon can be reduced so that more of the silicate results from the silicon substrate and, in this way, the depth of the shallow junction from the silicate can be varied not only between transistors, but the source and drain of a transistor can be of different junction depths. Accordingly, this ability to dope the deposited silicon material 42 to change the silicidation rate provides the capability to tailor the depth of the junction from the silicide.

Figure 3F:
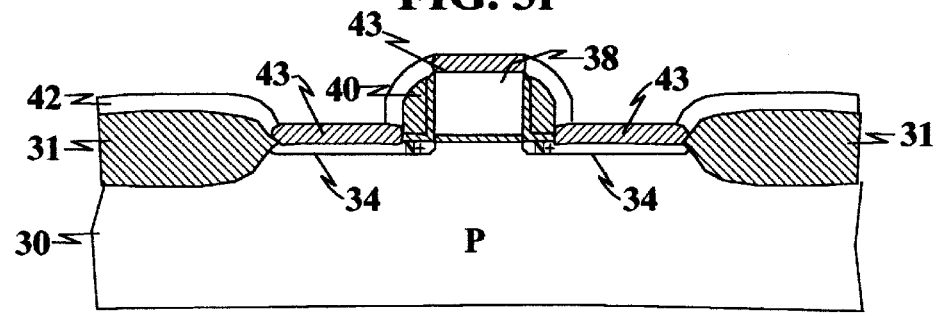
FIG. 3f is a cross-sectional view of the portion of the semiconductor substrate of FIG. 3e with the refractory metal reacted with the silicon containing material and slightly with the N+ silicon substrate to form metal silicide.
Figure 3G:
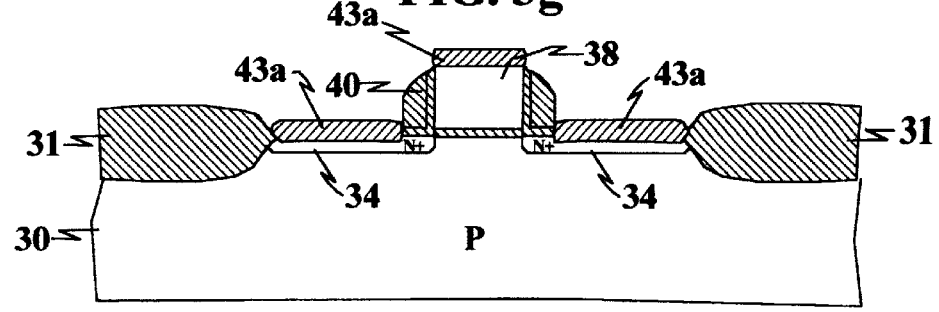
FIG. 3g is a cross-sectional view of the portion of the semiconductor substrate of FIG. 3f with the silicon containing material removed from isolation regions and the sidewalls.

The substrate 30 is now subjected to a rapid thermal anneal at about 650° C. to cause the formation of titanium silicide 43. Because silicidation takes place much faster in amorphous silicon than single crystal silicon, most of titanium silicide forms above the original surface of the silicon substrate 30 and does not encroach on the shallow N+/P junctions 34 as shown in FIG. 3f. The silicidation is followed by using a selective etch to remove the unsilicided amorphous silicon without etching the titanium silicide and then the substrate is subjected to another rapid thermal anneal at about 800° C. which converts the C49 phase of the silicide 43 into a much less resistive or more conductive and stable phase C54 of silicide 43a with the result being shown in FIG. 3g. Silicides of titanium, cobalt, platinum, palladium and nickel exhibit the lowest resistivities and they are 3–8, 16–18, 28–30 30–35 and 50 Ω-cm.

Figure 3H:
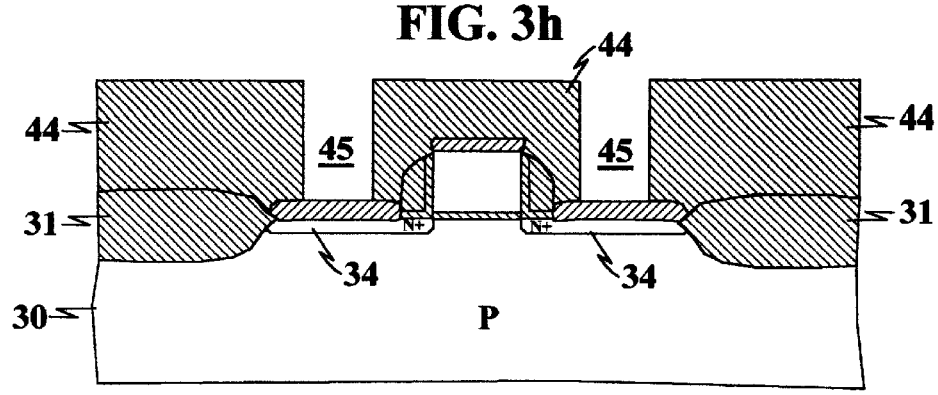
FIG. 3h is a cross-sectional view of the portion of the semiconductor substrate of FIG. 3g with an interlevel insulating layer having contact openings to the metal silicide of the source and drain.
Figure 3I:
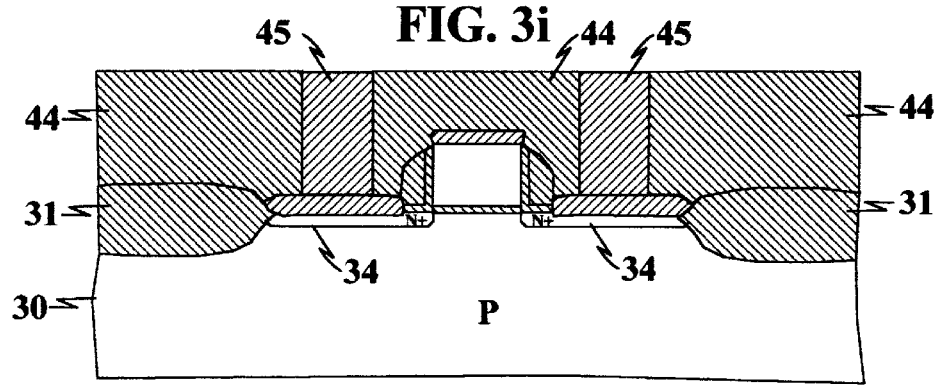
FIG. 3i is a cross-sectional view of the portion of the semiconductor substrate of FIG. 3h with the contact openings filled with a conductive material.

The remainder of the method of the present invention follows conventional practice as shown in FIGS. 3h and 3i with the deposition of an interlayer insulating layer 44, herein silicon oxide from a source of tetraethylothosilcate (TEOS) or alternatively tetramethylcyclotetrasiloxane (TMCTS), followed by planarization using preferably chemcial/mechanical polish with a commercially available slurry. Contact opening 45 are plasma etched, using an reactive ion etcher with carbon tetraflouride/hydrogen, in the insulating layer 44 as shown in FIG. 3h and filled with a conductive material 46, herein tungsten, as shown in FIG. 3i.

Although this description of silicidation method of the present invention has focused on an N-type transistor, it has equal application to P-type transistors (P+/N shallow junctions) and CMOS transistors (both N+/P and P+/N shallow junctions). This silicidation method also can be used in fabricating bipolar and biCMOS transistors and has special advantages in fabricating bipolar transistors with shallow emitters as will be described in reference to FIGS. 4a–4g.

Figure 4A:
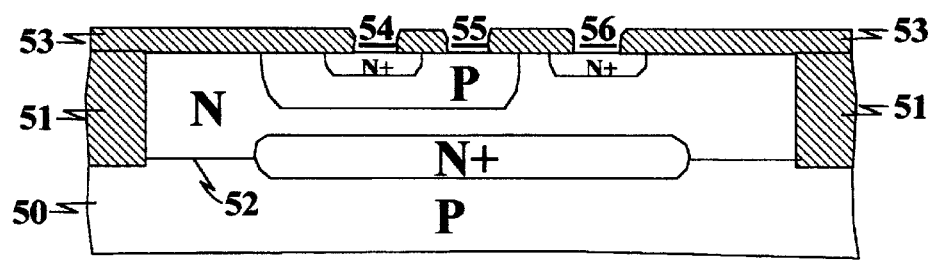
FIG. 4a is a cross-sectional view of the portion of a semiconductor substrate with isolation regions on opposite sides of a partially completed bipolar transistor having an emitter, base and collector and an insulating layer over the semiconductor substrate with openings to the emitter, base and collector.
Figure 4B:
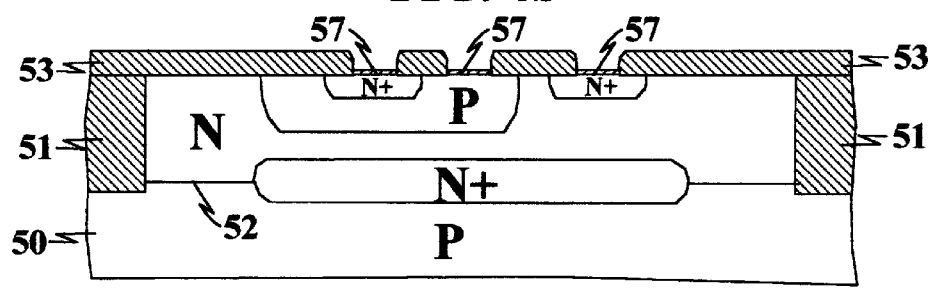
FIG. 4b is a is a cross-sectional view of the portion of the semiconductor substrate of FIG. 4a with a refractory metal selectively deposited on semiconductor substrate surface over the emitter, base and gate.
Figure 4C:
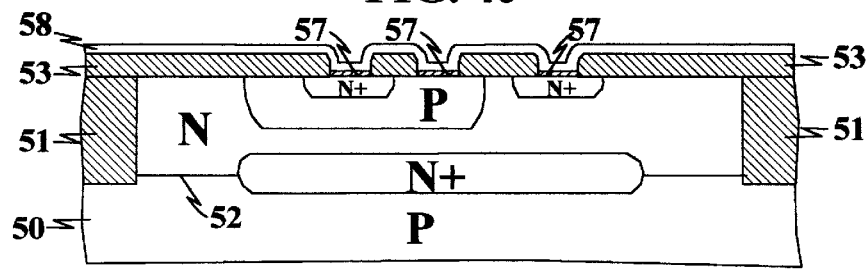
FIG. 4c is a cross-sectional view of the portion of the semiconductor substrate of FIG. 4b with a layer of a silicon containing material deposited on the insulating layer and the refractive metal.
Figure 4D:
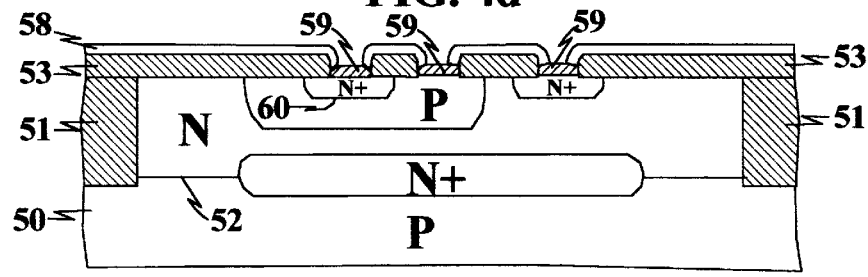
FIG. 4d is a cross-sectional view of the portion of the semiconductor substrate of FIG. 4c with the refractive metal reacted with the silicon containing material and slightly with the N+ silicon substrate to form metal silicide.
Figure 4E:
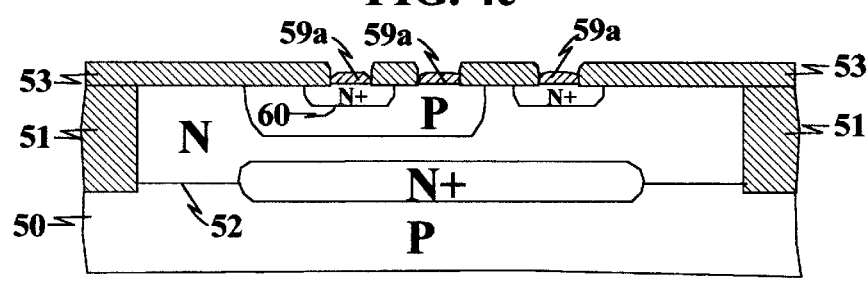
FIG. 4e is a cross-sectional view of the portion of the semiconductor substrate of FIG. 4d with the silicon containing layer removed from the insulating layer.

As shown in FIG. 4a, a bipolar transistor is shown in a silicon substrate 50 between vertical isolating trenches 51 and N/P horizontal isolation 52. An insulating layer 53, herein silicon oxide, is on the surface of the silicon substrate and the layer 53 contains an opening 54 for contacting the emitter, an opening 55 for contacting the base, and an opening 56 for contacting the collector as shown in FIG. 4a. Alternatively, the insulating layer 53 can be a composite of an underlying pad silicon oxide layer and an upper silicon nitride layer. A refractory metal 57, herein titanium, is selectively CVD deposited, using commercially available equipment, on the exposed emitter, base and collector through openings 54, 55 and 56, respectively, to a thickness of about 300–400 Å, preferably about 400 Å, as shown in FIG. 4b. Now, in accordance with the present invention, a silicon containing material 58, which silicates faster than single crystal silicon and which herein is amorphous silicon, is sputter deposited to a thickness of about 650 to 850 Å, using silicon as the target source shown in FIG. 4c. The substrate 50 is now subjected to a rapid thermal anneal at about 650° C. to cause the formation of titanium silicide 59. Because silicidation takes place much faster in amorphous silicon than single crystal silicon, most of titanium silicide forms above the original surface of the silicon substrate 50 and does not encroach on the shallow emitter N+/P junction 60 as shown in FIG. 4d. The silicidation is followed by using a plasma etch and an etchant gas, herein carbon tetrafluroide/oxygen, to remove the unsilicided amorphous silicon without etching the titanium silicide and then the substrate is subjected to another rapid thermal anneal at about 800° C. which converts the C49 phase of the silicide 59 into a much less resistive or more conductive phase C54 of silicide 59a with the result being shown in FIG. 4e.

Figure 4F:
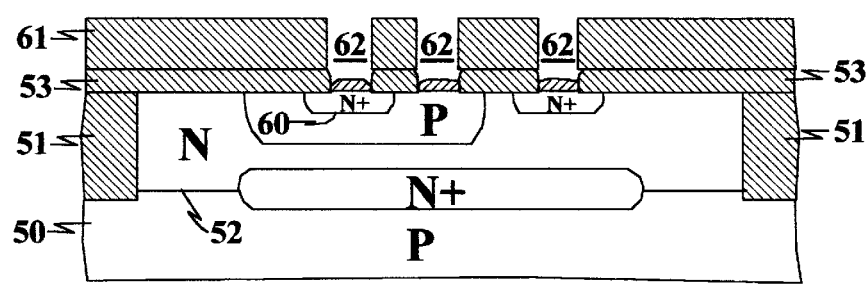
FIG. 4f is a cross-sectional view of the portion of the semiconductor substrate of FIG. 4e with an interlevel insulating layer having contact openings to the metal silicide of the emitter, base and collector.
Figure 4G:
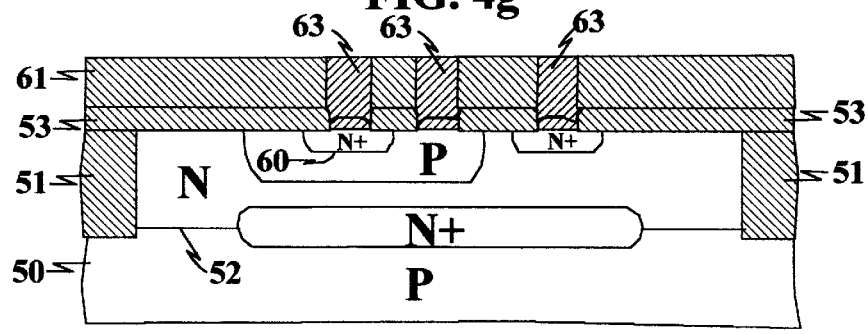
FIG. 4g is a cross-sectional view of the portion of the semiconductor substrate of FIG. 4f with the contact openings filled with a conductive material.

The remainder of the method of the present invention follows conventional practice as shown in FIGS. 4f and 4g with the deposition of an interlayer insulating layer 61, herein silicon oxide from TEOS, followed by planarization using preferably chemcial/mechanical polish and a commercially available slurry. Contact opening 62 are etched in the silicon oxide insulating layer 61, using anisotropic etching with carbon tetrafluoride/hydrogen as the etchant gas, as shown in FIG. 4f, and filled with a conductive material 63, herein tungsten, as shown in FIG. 4g.

Although this invention has been described relative to specific materials, and apparatuses for depositing and etching these materials, it is not limited to the specific materials or apparatuses but only to their specific characteristics. Other materials and apparatus can be substituted for those described herein which will be well understood by those skilled in the microelectronics and semiconductor arts after appreciating the present invention.

We claim:

1. In an integrated circuit in and on a silicon substrate having an active region including a field effect transistor with a source and a drain and a gate, all of which a conductive contact is made comprising:

a single crystalline silicon substrate with a upper surface region;

a shallow junction for each of the source and drain of the transistor underlying said upper surface of the silicon substrate;

a metal silicide layer having a lower surface disposed adjacent the shallow junction of each of the source and drain in the silicon substrate and above said upper surface of the silicon substrate; and an epitaxial silicon layer disposed between said upper silicon surface and said lower surface of metal silicide and adjacent the shallow junction of each of the source and drain whereby the metal silicide does not extend below the upper silicon surface and encroach upon the shallow junction of each of the source and the drain.

2. The integrated circuit of claim 1 wherein the metal silicide is titanium silicide comprising C54 phase.

3. The integrated circuit of claim 1 wherein the shallow junction is N+/P.

4. The integrated circuit of claim 1 wherein the shallow junction is P+/N.

5. The integrated circuit of claim 1 wherein said gate includes and upper surface and a silicide layer is disposed on said upper layer.

6. The integrated circuit of claim 1 wherein the depth of the shallow junction is less than about 2500 Å.

7. The integrated circuit of claim 6 wherein the depth of the N+/P shallow junction is about 1000 Å.

8. The integrated circuit of claim 6 wherein the depth of the P+/N shallow junction is about 1200 Å.

9. The integrated circuit of claim 1 wherein the metal silicide has a resistivity in the range of about 3 to 50 Ω-cm.

10. In an integrated circuit in and on a silicon substrate having an active region including a bipolar transistor with an emitter, base and collector all of which a conductive contact is made comprising:

a single crystalline silicon substrate with a upper surface region;

a shallow junction for the emitter of the transistor underlying said upper surface of the silicon substrate;

a metal silicide layer having a lower surface disposed adjacent the shallow junction of the emitter of the transistor in the silicon substrate and above said upper surface of the silicon substrate; and an epitaxial silicon layer disposed between said upper silicon surface and said lower surface of metal silicide and adjacent the shallow junction of the emitter whereby the metal silicide does not extend below the upper silicon surface and encroach upon the shallow junction of the emitter.

11. The integrated circuit of claim 10 wherein the metal silicide is titanium silicide comprising C54 phase.

12. The integrated circuit of claim 10 wherein the metal silicide has a resistivity in the range of about 3 to 50 Ω-cm.

13. The integrated circuit of claim 10 wherein the metal silicide is disposed adjacent of the upper silicon surface at the base and collector regions.

* * * * *